United States Patent
Ou

(10) Patent No.: US 11,296,308 B2
(45) Date of Patent: Apr. 5, 2022

(54) FLEXIBLE DISPLAY DEVICE MANUFACTURING METHOD AND FLEXIBLE DISPLAY DEVICE

(71) Applicant: Wuhan China Star Optoelectronics Semiconductor Display Technology Co., Ltd., Hubei (CN)

(72) Inventor: Yangfeng Ou, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 244 days.

(21) Appl. No.: 16/621,819

(22) PCT Filed: Jan. 7, 2019

(86) PCT No.: PCT/CN2019/070719
§ 371 (c)(1),
(2) Date: Dec. 12, 2019

(87) PCT Pub. No.: WO2020/124700
PCT Pub. Date: Jun. 25, 2020

(65) Prior Publication Data
US 2021/0328202 A1    Oct. 21, 2021

(30) Foreign Application Priority Data
Dec. 20, 2018    (CN) .......................... 201811565638.4

(51) Int. Cl.
*H01L 51/56*    (2006.01)
*H01L 27/32*    (2006.01)
*H01L 51/00*    (2006.01)

(52) U.S. Cl.
CPC .......... *H01L 51/56* (2013.01); *H01L 27/3276* (2013.01); *H01L 51/0097* (2013.01); *H01L 2227/323* (2013.01)

(58) Field of Classification Search
CPC .................................................. H01L 51/0097
See application file for complete search history.

(56) References Cited

U.S. PATENT DOCUMENTS 11,119,537 B2 *    9/2021    Jeong .................... G06F 1/1652

* cited by examiner

*Primary Examiner* — Vip Patel
(74) *Attorney, Agent, or Firm* — Taft Stettinius & Hollister LLP

(57) ABSTRACT

The present invention provides a flexible display device manufacturing method and a flexible display device. The flexible display device manufacturing method of the present invention protects a folding region by adhering a protective tape on an entire surface of the folding region of a flexible display panel. Compared to the prior art of coating an ultraviolet glue on the folding region to form a protective layer, the method can effectively improve flatness of the surface of the protective layer in the folding region to advantage folding and shaping of the folding region, lower a risk of circuit wires in the folding region broken during the folding process, further reduce a defect rate of the products during the folding process and enhance quality of the products.

8 Claims, 6 Drawing Sheets

FLEXIBLE DISPLAY DEVICE MANUFACTURING METHOD AND FLEXIBLE DISPLAY DEVICE

CROSS-REFERENCE TO RELATED APPLICATIONS

This application is a U.S. National Phase of International PCT Application No. PCT/CN2019/070719 filed Jan. 7, 2019, which claims the benefit of Chinese Patent Application Serial No. 201811565638.4 filed Dec. 20, 2018, the contents of each application are incorporated herein by reference in their entirety.

FIELD OF INVENTION

The present invention relates to a field of display technologies, especially to a flexible display device manufacturing method and a flexible display device.

BACKGROUND OF INVENTION

Conventional flat display devices in the market comprises liquid crystal (LCD) displays and organic light emitting diode (OLED) displays. The OLED has excellent characteristics such as self-illumination, high brightness, wide viewing angle, high contrast, flexibility, low energy consumption, rich color, fast response, and capability of manufacturing flexible screens, and therefore has aroused great interest from scientific research and industries. The OLED is considered to be a promising next-generation display technology, has gradually replaced traditional LCD displays and is widely used in mobile phone screens, computer displays, full-color TVs, etc.

A conventional flat display generally comprises a display panel and an externally connected circuit. When the display panel displays normally, an externally connected circuit is required, for example, a flexible printed circuit (FPC) board and a chip on film (COF) are connected to an outer lead bonding (OLB) region of a display panel through leads, electrical connection between the externally connected circuit and the OLB region of the display panel is completed by a bonding process to achieve transmission of drive signals to each of signal wires in the display panel.

With development of technologies, flexible display devices are gradually used extensively. A flexible OLED display device, as a most promising flexible display technology, has increasing investment and market share. With reference to FIGS. 1 and 2, a conventional flexible display device comprises a flexible display panel 100 and a flexible circuit board 200 bonded to the flexible display panel 100. A binding region 110 is disposed at an end of the flexible display panel 100, the flexible circuit board 200 is bonded to the binding region 110 of the flexible display panel 100, and the binding region 110 of the flexible display panel 100 is folded toward a rear surface of the flexible display panel 100 through a folding region 120 to be located on a rear surface of a displaying region 130 to reduce a width of a border of the display device and improve a screen ratio. The conventional technology, before folding the folding region 120 of the flexible display panel 100, coats and cures a protective adhesive layer 500 (for example, ultraviolet curing adhesive) on the folding region 110 of the flexible display panel 100, and then folds the folding region 120 of the flexible display panel 100 and the protective adhesive layer 500 thereon toward the rear surface of the flexible display panel 100. Disposing of the protective adhesive layer 500 is for protection to the folding region 120 of the flexible display panel 100. However, as shown in FIG. 2, because of the current adhesive coating method, the protective adhesive layer 500 on the folding region 120 is formed by repeatedly coating adhesive strips intersecting one another. In an intersecting point of two of the coating adhesive strips, the strips are stacked and cause an uneven surface of the protective adhesive layer 500 such that a flatness degree can only reach ±5 mm, which influences folding and shaping of the folding region 120 and results in defective products.

SUMMARY OF INVENTION

An objective of the present invention is to provide a flexible display device manufacturing method that can effectively improve flatness of a surface of a protective layer in a folding region to advantage folding and shaping of the folding region.

The objective of the present invention is also to provide a flexible display device that can effectively improve flatness of a surface of a protective layer in a folding region to advantage folding and shaping of the folding region.

To achieve the above objective, the present invention provides a flexible display device manufacturing method comprising:

a step S1, providing a flexible display panel;

the flexible display panel divided into a displaying region, a binding region outside the displaying region, and a folding region between the displaying region and the binding region;

the flexible display panel comprising a flexible substrate and a thin film transistor (TFT) array layer, a binding circuit, and circuit wires, wherein the TFT array layer, the binding circuit, and the circuit wires are disposed on the flexible substrate and correspond to the displaying region, the binding region, and the folding region respectively;

a step S2, providing a protective tape, adhering the protective tape entirely on a portion of the flexible substrate in the folding region to cover and protect the circuit wires in the folding region; and a step S3, folding the folding region to locate the binding region on a side of flexible substrate away from the TFT array layer in the displaying region.

An elastic modulus of the protective tape provided by the step S2 is the same as an elastic modulus of the flexible substrate.

The flexible substrate is a polyimide substrate.

A supporting board is disposed on a side of the flexible substrate away from the TFT array layer, and the supporting board covers another region of the flexible display panel other than the folding region; and the step S1 further comprises providing a flexible circuit board and binding the flexible circuit board to the binding region of the flexible display panel.

The step S3 further comprises providing a foam pad, disposing the foam pad on the side of the flexible substrate away from the TFT array layer in the displaying region, and locating the foam pad between the binding region the displaying region.

The present invention also provides a flexible display device, comprising a flexible display panel; wherein the flexible display panel is divided into a displaying region, a binding region outside the displaying region, and a folding region between the displaying region and the binding region;

the binding region is located on a rear surface of the displaying region by folding the folding region;

the flexible display panel comprises a flexible substrate and a thin film transistor (TFT) array layer, a binding circuit, and circuit wires, wherein the TFT array layer, the binding circuit, and the circuit wires are disposed on the flexible substrate and correspond to the displaying region, the binding region, the folding region respectively; and a protective tape is disposed in the folding region, is entirely adhered on the flexible substrate, and covers and protect the circuit wires.

An elastic modulus of the protective tape is the same as an elastic modulus of the flexible substrate.

The flexible substrate is a polyimide substrate.

The flexible display device further comprises a flexible circuit board bonded to the binding region of the flexible display panel;

wherein a supporting board is disposed on a side of the flexible substrate away from the TFT array layer, and the supporting board covers another region of the flexible display panel other than the folding region.

The flexible display device further comprises a foam pad disposed on a side of the flexible substrate away from the TFT array layer in the displaying region, wherein the foam pad is located between the binding region and the displaying region.

Advantages of the present invention are as follows. The present invention provides a flexible display device manufacturing method that protects a folding region by adhering a protective tape on an entire surface of the folding region of a flexible display panel. Compared to the prior art of coating an ultraviolet glue on the folding region to form a protective layer, the method can effectively improve flatness of the surface of the protective layer in the folding region to advantage folding and shaping of the folding region, lower a risk of circuit wires in the folding region broken during the folding process, further reduce a defect rate of the products during the folding process and enhance quality of the products. The flexible display device of the present invention protects a folding region by adhering a protective tape on an entire surface of the folding region of a flexible display panel, which can effectively improve flatness of the surface of the protective layer in the folding region to advantage folding and shaping of the folding region, lower a risk of circuit wires in the folding region broken during the folding process, further reduce a defect rate of the products during the folding process and enhance quality of the products.

To further understand the features and technical contents of the present invention, the following detailed description and accompanying drawings of the present invention are referred to. However, the accompanying drawings are only provided for reference and explanation, and are not intended to limit the present invention.

DESCRIPTION OF DRAWINGS

Specific embodiments of the present invention are described in details with accompanying drawings as follows to make technical solutions and advantages of the present invention clear.

In the drawings.

DETAILED DESCRIPTION OF PREFERRED EMBODIMENTS

To further describe technical solutions and effect thereof of the present invention, preferred embodiments of the present invention are described in details with accompanying drawings as follows.

Figure 1:
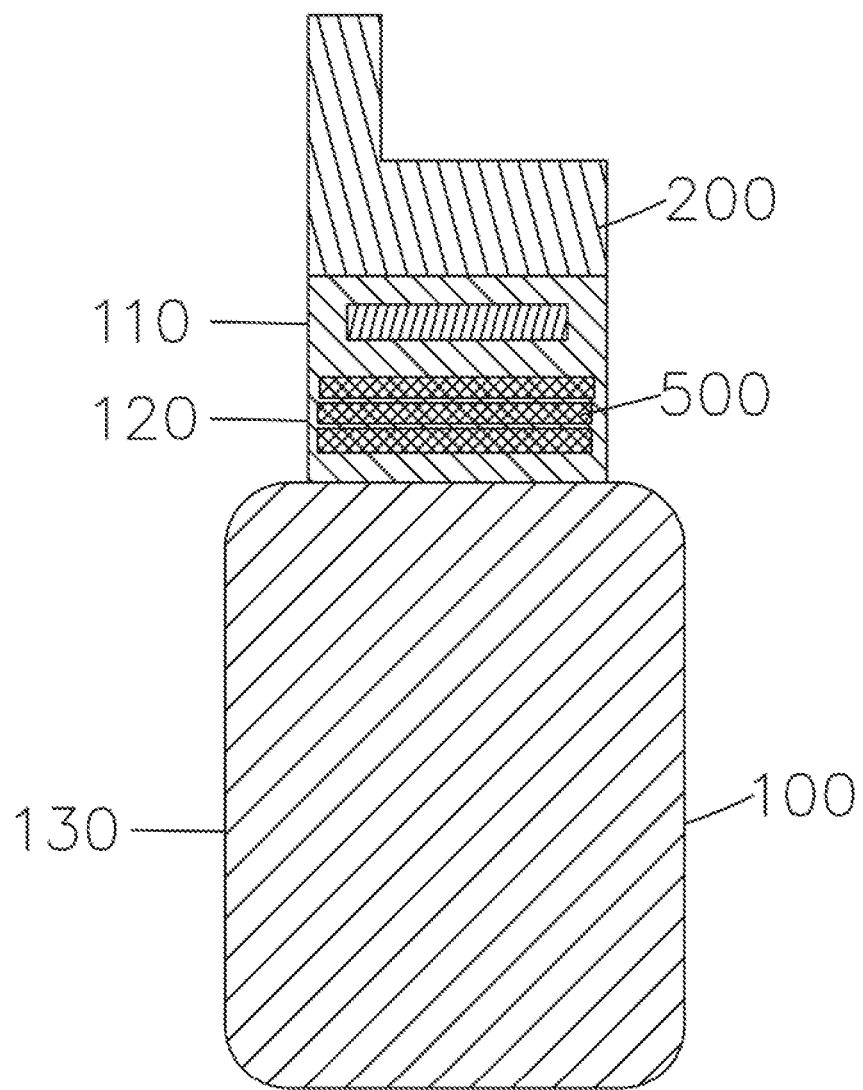
FIG. 1 is a schematic view of a conventional flexible display device having a protective adhesive layer coated and formed in a folding region.
Figure 2:
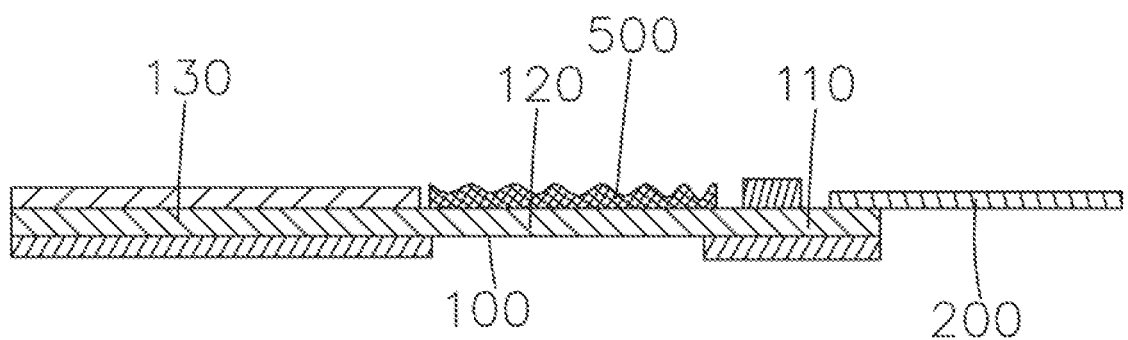
FIG. 2 is a schematic side view of the conventional flexible display device before folding.
Figure 3:
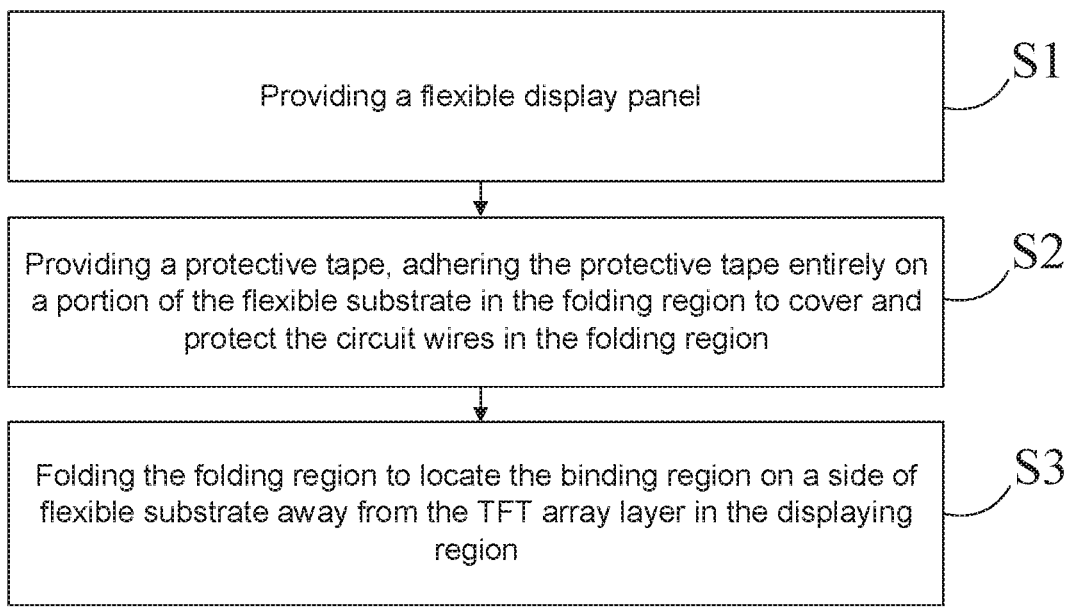
FIG. 3 is a flowchart of a flexible display device manufacturing method of the present invention.

With reference to FIG. 3, FIG. 3 is a flowchart of a flexible display device manufacturing method of the present invention, the present embodiment specifically comprises steps 1 to 3.

The step S1 provides flexible display panel 10.

Specifically, the flexible display panel 10 is divided into a displaying region 1, a binding region 2 outside the displaying region 1, and a folding region 3 between the displaying region 1 and the binding region 2.

Figure 5:
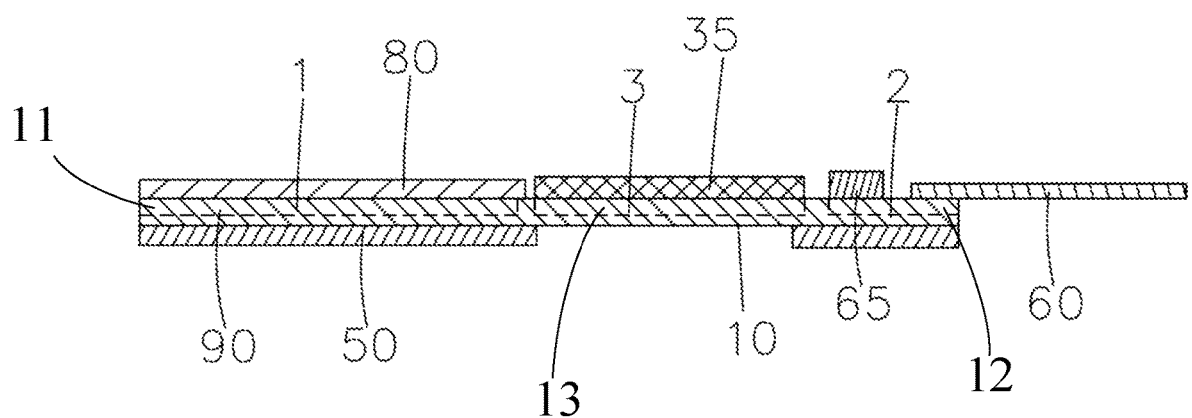

With reference to FIG. 5, the flexible display panel 10 comprises a flexible substrate 90, a thin film transistor (TFT) array layer 11 and an organic light emitting diode (OLED) device layer disposed sequentially on the flexible substrate 90 and corresponding to the displaying region 1. A binding circuit 12 and circuit wires 13 (not shown in the figures) are disposed on a side of the TFT array layer 11 on the flexible substrate 90 and are located respectively in the binding region 2 and the folding region 3. A rear surface of the flexible display panel 10 is a side of flexible substrate 90 away from the TFT array layer 11, and a front surface of the flexible display panel 10 is a side opposite to the rear surface.

Specifically, the flexible substrate 90 can be but is not limited to a polyimide (PI) substrate.

Specifically, the TFT array layer 11 comprises a plurality of TFTs, the TFTs can be indium gallium zinc oxide semiconductor TFTs, and can be low temperature polycrystalline TFTs, and of course can be other common TFTs used in other conventional technologies.

Specifically, the flexible display panel 10 further comprises a thin filmed encapsulation layer covering the OLED device layer and configured to prevent water oxygen from entering the OLED device layer.

Specifically, the step S1 further comprises disposing a polarizer 80 in the displaying region 1 of the flexible display panel 10.

Specifically, in the flexible display panel 10 provided by the step S1, a supporting board 50 is disposed on the rear surface of the flexible substrate 90, and the supporting board 50 covers another region of the flexible display panel 10 other than the folding region 3.

Specifically, the step S1 further comprises providing a flexible circuit board 60 and binding the flexible circuit board 60 to the binding region 2 of the flexible display panel 10.

Specifically, a driver chip 65 is disposed on and bonded to the binding region 2.

Figure 4:
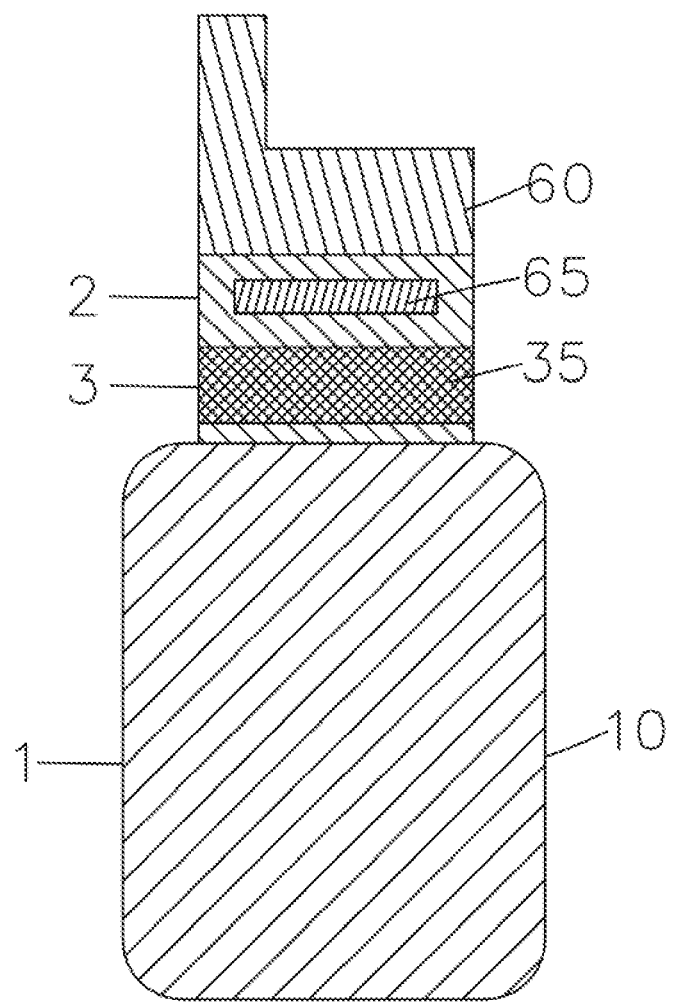
FIGS. 4 and 5 are schematic views of a step S2 of the flexible display device manufacturing method of the present invention.

The step S2, as shown in FIGS. 4 and 5, provides a protective tape 35, adheres the protective tape 35 entirely on a portion of the flexible substrate 90 on the front surface of the folding region 3 of the flexible display panel 10 to protect the circuit wires of the folding region 3, lower a risk of circuit wires broken during a later folding process, and disperse stress applied to the circuit wires.

Specifically, to achieve modulus matching, an elastic modulus of the protective tape 35 provided by the step S2 is the same as an elastic modulus of the flexible substrate 90.

Specifically, a surface of the protective tape 35 undergoes a smoothing process to guarantee flatness of the surface and facilitate later folding and shaping of the folding region 3, lower a risk of the circuit wires broken in the folding region 3 during the folding process.

Figure 6:
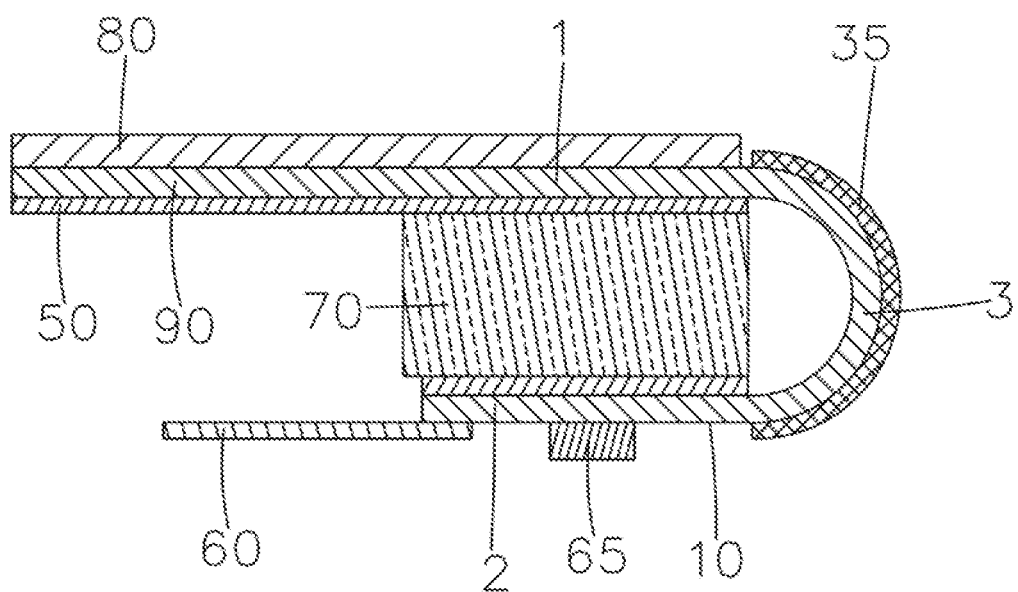
FIG. 6 is a schematic view of a step S3 of the flexible display device manufacturing method of the present invention.

The step S3, as shown in FIG. 6, folding the folding region 3 to locate the binding region 2 located on a rear surface of the displaying region 1.

Specifically, the step S3 further comprises disposing the foam pad 70 between the binding region 2 and the displaying region 1 on the rear surface of the displaying region 1.

The flexible display device manufacturing method of the present invention protects the folding region 3 by adhering a protective tape 35 on an entire surface of the folding region 3 of a flexible display panel 10. Compared to the prior art of coating an ultraviolet glue on the folding region to form a protective layer, the method can effectively improve flatness of the surface of the protective layer in the folding region 3 to advantage folding and shaping of the folding region 3, lower a risk of circuit wires in the folding region 3 broken during the folding process, further reduce a defect rate of the products during the folding process and enhance quality of the products.

On the basis of the same inventive concept, the present invention also provides a flexible display device comprising a flexible display panel 10. The flexible display panel 10 is divided into a displaying region 1, a binding region 2 outside the displaying region 1, and a folding region 3 between the displaying region 1 and the binding region 2.

Specifically, the binding region 2 is located on the rear surface of the displaying region 1 by folding the folding region 3.

With reference to FIG. 5, the flexible display panel 10 comprises a flexible substrate 90, a thin film transistor (TFT) array layer 11 and an organic light emitting diode (OLED) device layer disposed sequentially on the flexible substrate 90 and corresponding to the displaying region 1. A binding circuit 12 and circuit wires 13 are disposed on a side of the TFT array layer on the flexible substrate 90 and are located respectively in the binding region 2 and the folding region 3. A rear surface of the flexible display panel 10 is a side of flexible substrate 90 away from the TFT array layer 11, and a front surface of the flexible display panel 10 is a side opposite to the rear surface.

Specifically, the flexible substrate 90 can be but is not limited to a polyimide substrate.

Specifically, the TFT array layer 11 comprises a plurality of TFTs, the TFTs can be indium gallium zinc oxide semiconductor TFTs, and can be low temperature polycrystalline TFTs, and of course can be other common TFTs used in other conventional technologies.

Specifically, the flexible display panel 10 further comprises a thin film encapsulation layer covering the OLED device layer and configured to prevent water oxygen from entering the OLED device layer.

Specifically, a polarizer 80 is disposed in the displaying region 1 of the flexible display panel 10.

Specifically, a supporting board 50 is disposed on the rear surface of the flexible substrate 90, and the supporting board 50 covers another region of the flexible display panel 10 other than the folding region 3.

Specifically, a protective tape 35 is adhered entirely on the flexible substrate 90 on the front surface of the folding region 3 to cover and protect the circuit wires in the folding region 3.

Specifically, an elastic modulus of the protective tape 35 is the same as an elastic modulus of the flexible substrate 90.

Specifically, a flexible circuit board 60 is disposed in and bonded to the binding region 2 of the flexible display panel 10.

Specifically, a driver chip 65 is disposed in and bonded to the binding region 2.

Specifically, the binding region 2 has a foam pad 70 disposed between the rear surface of the displaying region 1 and the displaying region 1.

The flexible display device of the present invention protects the folding region 3 by adhering a protective tape 35 on an entire surface of the folding region 3 of a flexible display panel, which can effectively improve flatness of the surface of the protective layer in the folding region to advantage folding and shaping of the folding region 3, lower a risk of circuit wires in the folding region 3 broken during the folding process, further reduce a defect rate of the products during the folding process and enhance quality of the products.

As described above, present invention provides a flexible display device manufacturing method that protects a folding region by adhering a protective tape on an entire surface of the folding region of a flexible display panel. Compared to the prior art of coating an ultraviolet glue on the folding region to form a protective layer, the method can effectively improve flatness of the surface of the protective layer in the folding region to advantage folding and shaping of the folding region, lower a risk of circuit wires in the folding region broken during the folding process, further reduce a defect rate of the products during the folding process and enhance quality of the products. The flexible display device of the present invention protects a folding region by adhering a protective tape on an entire surface of the folding region of a flexible display panel, which can effectively improve flatness of the surface of the protective layer in the folding region to advantage folding and shaping of the folding region, lower a risk of circuit wires in the folding region broken during the folding process, further reduce a defect rate of the products during the folding process and enhance quality of the products.

As described above, for a person having ordinary skill in the art, changes and modifications can be made according to technical solutions and technical concepts of the present invention, and all of the changes and modifications shall be within the protective scope of the present invention.

What is claimed is:

1. A flexible display device, comprising a flexible display panel; wherein
    the flexible display panel is divided into a displaying region, a binding region outside the displaying region, and a folding region between the displaying region and the binding region;
    the binding region is located on a rear surface of the displaying region by folding the folding region;
    the flexible display panel comprises a flexible substrate, and a thin film transistor (TFT) array layer, a binding circuit, and circuit wires disposed on the flexible substrate, wherein the TFT array layer corresponds to the displaying region, the binding circuit corresponds to the binding region, and the circuit wires correspond to the folding region; and a protective tape is disposed in the folding region, is entirely adhered on the flexible substrate, and is disposed over the circuit wires;
wherein an elastic modulus of the protective tape is same as an elastic modulus of the flexible substrate.

2. The flexible display device as claimed in claim 1, wherein the flexible substrate is a polyimide substrate.

3. The flexible display device as claimed in claim 1 further comprising a flexible circuit board bonded to the binding region of the flexible display panel;
wherein a supporting board is disposed on a side of the flexible substrate away from the TFT array layer, and the supporting board covers another region of the flexible display panel other than the folding region.

4. The flexible display device as claimed in claim 1 further comprising a foam pad disposed on a side of the flexible substrate away from the TFT array layer in the displaying region, wherein the foam pad is located between the binding region and the displaying region.

5. A flexible display device manufacturing method, comprising:
a step S1, providing a flexible display panel;
the flexible display panel divided into a displaying region, a binding region outside the displaying region, and a folding region between the displaying region and the binding region;
the flexible display panel comprising a flexible substrate, and a thin film transistor (TFT) array layer, a binding circuit, and circuit wires, wherein the TFT array layer, the binding circuit, and the circuit wires are disposed on the flexible substrate, the TFT array layer corresponds to the displaying region, the binding circuit corresponds to the binding region, and the circuit wires correspond to the folding region;
a step S2, providing a protective tape, adhering the protective tape entirely on a portion of the flexible substrate in the folding region, wherein the protective tape is disposed over the circuit wires in the folding region; and
a step S3, folding the folding region to locate the binding region on a side of flexible substrate away from the TFT array layer in the displaying region;
wherein an elastic modulus of the protective tape provided by the step S2 is same as an elastic modulus of the flexible substrate.

6. The flexible display device manufacturing method as claimed in claim 5, wherein the flexible substrate is a polyimide substrate.

7. The flexible display device manufacturing method as claimed in claim 5, wherein
a supporting board is disposed on a side of the flexible substrate away from the TFT array layer, and the supporting board covers another region of the flexible display panel other than the folding region; and
the step S1 further comprises providing a flexible circuit board and binding the flexible circuit board to the binding region of the flexible display panel.

8. The flexible display device manufacturing method as claimed in claim 5, wherein the step S3 further comprises providing a foam pad, disposing the foam pad on the side of the flexible substrate away from the TFT array layer in the displaying region, and locating the foam pad between the binding region the displaying region.

* * * * *